United States Patent [19]

Samuels et al.

[11] Patent Number: 5,304,441
[45] Date of Patent: Apr. 19, 1994

[54] METHOD OF OPTIMIZING EXPOSURE OF PHOTORESIST BY PATTERNING AS A FUNCTION OF THERMAL MODELING

[75] Inventors: Donald J. Samuels, Yorktown Heights; Roger J. Yerdon, Pleasant Valley, both of N.Y.

[73] Assignee: International Business Machines Corporation, Armonk, N.Y.

[21] Appl. No.: 999,439

[22] Filed: Dec. 31, 1992

[51] Int. Cl.$^5$ .......................... G03F 7/02; G03F 7/20
[52] U.S. Cl. ...................................... 430/30; 430/296; 430/327; 430/328; 430/330; 430/394; 430/494; 430/942
[58] Field of Search ................. 430/30, 296, 327, 328, 430/330, 394, 494, 942

[56] References Cited

U.S. PATENT DOCUMENTS

| | | | |
|---|---|---|---|
| 3,900,736 | 8/1975 | Michail et al. | 250/492 A |
| 4,504,558 | 3/1985 | Bohlen | 430/30 |
| 4,544,846 | 10/1985 | Langner et al. | 250/396 ML |
| 4,576,884 | 3/1986 | Reisman | 430/30 |
| 4,818,885 | 4/1989 | Davis et al. | 250/492.2 |
| 4,864,356 | 9/1989 | Asano et al. | 430/30 |
| 5,082,762 | 1/1992 | Takahashi | 430/296 |
| 5,112,724 | 5/1992 | Bradshaw | 430/394 |

OTHER PUBLICATIONS

T. H. P. Chang, et al., "A Computer-Controlled Electron-Beam Machines for Microcircuit Fabrication" IEEE Transactions on Electron Devices, vol. ED-19, No. 5, May 1972, pp. 629–635.

*Primary Examiner*—Richard L. Schilling
*Attorney, Agent, or Firm*—Graham S. Jones; Dale M. Crockatt

[57] ABSTRACT

A method of adjusting exposure of an energy beam to a lithographic resist sensitive to the energy beam, which method comprises determining where in a pattern to be exposed the energy level will exceed a critical thermal level, and adjusting the pattern and kind of exposure of the resist where the critical level is exceeded. One technique is to adjust the level exposure of the resist to a lower level equal to or less than the critical level with repeated exposures of the pattern in areas where the critical level is exceeded. The energy level monitored can be a thermal level measured as a temperature of the resist. A second technique is to adjust the exposure level by modifying the pattern and duration of exposure of the resist to a longer duration providing exposures equal to or less than the critical level with the modified pattern of exposures of the pattern in areas where the critical level is exceeded.

5 Claims, 5 Drawing Sheets

METHOD OF OPTIMIZING EXPOSURE OF PHOTORESIST BY PATTERNING AS A FUNCTION OF THERMAL MODELING

BACKGROUND OF THE INVENTION

1. Field of the Invention

This invention relates to an energy beam exposure system for exposing lithographic resist by using a beam which is scanned across the resist, and more particularly it relates to a system for analysis of heating produced by scanning and providing modified scanning patterns for avoiding overheating of the resist.

2. Description of related art.

A system known as the Hontas (EL3) type of E-beam exposure system for writing patterns on resist writes lithographic patterns in the resist with a shaped electron beam exposure system which minimizes the time wasted by workpiece positional requirements. The writing field is pieced together by sequential exposure of an array of rectangular sub-fields written in a raster sequence. An early version of the Hontas system of E-beam exposure is described in U.S. Pat. No. 3,900,736 of Michael et al for "Method and Apparatus for Positioning a Beam of Charged Particles" (commonly assigned.) The Hontas system employs a step-and-repeat method of performing the tasks of registration, writing and transporting of the workpiece to expose each field of a multi-field pattern on a workpiece. In the E-beam writing process employed in the Hontas system, the work table is in continuous mechanical motion in the X-Y plane beneath the E-beam. The motion is generally provided along a serpentine, boustrophedontic path, as the oxen plow from one end of a column to the next column along the "Y" axis. Thus, the continuous motion occurs along one axis herein defined as the "Y" axis, whereas the motion at right angles to the X axis, at the end of each column, occurs as a step function at the end of each Y axis excursion in the direct-ion referred to herein as the "X" axis.

An E-beam source produces a beam which is shaped into various spot shapes and blanked by a deflection and aperture apparatus under the control of spot shaping apparatus and blanking apparatus as in Michael et al U.S. Pat. No. 3,900,736 cited above. The positioned and shaped spot is controlled, in part, by spot shaping, and a blanking analog electronics unit under the control of digital electronics in pattern control section. This determines the pattern written in the sub-field under control of the control computer, as in Michael et al above. A pattern control section supplies signals to the spot shaping, blanking analog electronics unit. The shaped beam is vector positioned under the control of vector deflection apparatus. After each sub-field is completed the next sub-field is positioned by the large field deflection apparatus under the control of a large field deflection system. A pattern control section supplies signals to control a deflection system. The large field deflection apparatus may incorporate a Variable Axis Immersion Lens arrangement as described in Lananer et al U.S. Pat. No. 4,544,846. That arrangement permits the beam to be deflected farther from the axis of the electron beam column to provide a large range writing capability. The next sub-field is positioned orthogonally with respect to the direction of motion of the X-Y drive work table which supports the workpiece which usually has been a semiconductor wafer. However, at the edge of the writing field the exception is that the sub-field is positioned normally (or at right angles) with the direction of motion. The result of this sub-field positioning scheme in combination with a continuously moving work table is a continuously moving, boustrophedontic raster scan. The raster scan positioning of the sub-fields is controlled by the large field deflection control system containing electronic circuitry and pattern data from the pattern control section. A motion compensating signal from stage (work table) position measurement system is received by large field deflection system from the laser stage (work table) position measurement system. Measurement system preferably directs a pair of laser beams at two edges of the work table to measure table position as will be understood by those skilled in the art. Electronics in the system provide signals to the deflection apparatus to compensate for X, Y, and angular errors resulting from the continuous motion of the work table while sub-fields are being written.

U.S. Pat. No. 4,818,885 Davis et al for "Electron beam writing method and system using large range deflection in combination with a continuously moving table" shows a modified Hontas system.

U.S. Pat. No. 4,544,846 of Langner et al for "Variable Axis Immersion Lens Electron Beam Projection System" (commonly assigned) describes an E-beam system with a variable axis immersion lens (VAIL).

U.S. Pat. No. 3,900,736 of Michael et al for "Method and Apparatus for Positioning a Beam of Charged Particles" (commonly assigned) describes an E-beam exposure system with a computer driven correction system for use with a four corner registration system. The correction system operates dynamically to correct the deflection of an electron beam to minimize the deviation from desired alignment. Such alignment problems are caused by factors including the deviation of the position of the registration marks from their design positions. The Hontas system of E-beam exposure employed by Michael et al has heretofore employed a step-and-repeat method of performing the tasks of registration, writing and transporting of the workpiece to expose each field of a multi-field pattern on a workpiece. Heretofore, the Hontas step-and-repeat system has employed an A cycle, a B cycle and a C cycle. During the A cycle, the workpiece has been registered while the workpiece on the transporting table was at rest. Then the B cycle has followed, during which time the pattern to be exposed has been written by the E-beam, while the workpiece and the table still remained at rest. Finally, only in the C cycle, has the table supporting the workpiece moved along its time consuming trip to the next location for exposing the next field on the workpiece. The MEBES system provides continuous mechanical motion of the worktable supporting the workpiece, but it does not reregister the workpiece with respect to the E-beam during the process of exposing the entire workpiece. This has the advantage of speed since the reregistration steps are eliminated with the risk that the alignment of the workpiece and the E-beam deviates significantly from the desired alignment.

A Hontas electron beam exposure system utilizes a shaped-electron-beam which is vector scanned within a sub-field in combination with an electrical raster scan system for positioning sub-fields over a large rectangular area in combination with a continuously moving mechanical system for writing large patterns with a minimum of interruption. More particularly, it relates to a pattern writing system with a steered electron beam. This invention also provides a registration system using the electron beam to determine the target position accurately relative to the electron beam writing system. The system preferably employs writing of lithographic patterns with a shaped electron beam exposure system which minimizes the time wasted by workpiece positional requirements. Large lithographic patterns are written with subpatterns in sub-fields in a vector writing mode without interruption between successive sub-fields. This is made possible by continuously moving the workpiece in combination with the writing capability of a large rectangular writing field. The writing field contains a rectangular array of electronically positioned sub-fields which are written in a raster sequence. The large width of the writing field provided by the VAIL system reduces the number of mechanical scans required to write the pattern on the workpiece which further reduces the time required by workpiece positioning. The continuous velocity of the continuously moving workpiece during Y axis scans along a column on the wafer is corrected during writing to compensate for pattern density, maintaining an optimum workpiece position relative to the writing field. When patterns are being superimposed over previously written patterns, a means of registration is required since processing can cause workpiece distortions that are not detectable by position measurement systems. Accurate positioning of the overall workpiece relative to positional measurement systems is impractical due to thermal effects and other error sources. This system includes a registration field confined to local a reason the workpiece, which is larger than the writing field, which can be used for registration, without requiring a height-related change in focus and without requiring the mechanical system comprising the X-Y work table to change speed during the registration and reregistration of the various fields on a semiconductor wafer. The registration field can be larger than the writing field, because the quality requirements demanded from the shaped-electron-beam are less for detecting the locations of such registration marks at the various locations on the wafer.

In accordance with this invention, a large lithographic pattern is written as quickly as possible by writing sub-field patterns in a vector scan mode. The sub-fields are positioned with a large field deflection system in combination with a continuously moving workpiece. This rectangular array of sub-fields provides several advantages which reduce the total time required to expose the workpiece (i. e. wafer or mask). The large field deflection capability provides registration capability on sparsely located registration marks by using the beam as a probe to locate the target fields accurately relative to the deflection systems. The advantages over prior art are:

1. A wide strip of sub-fields is written for each pass of the wafer, thus minimizing the number of passes required and the time required for reversing the work table motion and repositioning.
2. The large field deflection system provides the capability of positioning the sub-fields in a rectangular array thus providing a time buffer for dense and sparse patterns in the sub-fields. This capability reduces the velocity change requirements for the continuously moving work table.
3. Registration capability provides a more precise superposition of the written pattern over existing lithography.

As electrons penetrate the substrate, they undergo a scattering process which will diffuse the beam and degrade the image. This is a well known phenomenon which can be dealt with during the conversion of the CAD data to tool data (also known as numerical control or NC data) via proximity correction algorithms.

These algorithms all assume that the resists being exposed have no dependence on temperature. In fact, however, this assumption is not warranted. As resist heats up, it becomes more sensitive (goes from unexposed to exposed at a lower threshold). This will lead to a loss.:of image acuity and possibly to calamitous defects in the pattern being exposed.

In the past when this happens one of the following actions was taken:
Redesign the offending pattern
Slow the exposure system down
Reduce the dose the resist is receiving Each of these actions has major drawbacks. The first is usually not practical or achievable. The second reduces the throughput of an expensive exposure system, requiring the manufacturing plant to buy more systems. The third will leave other areas of the pattern unexposed.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
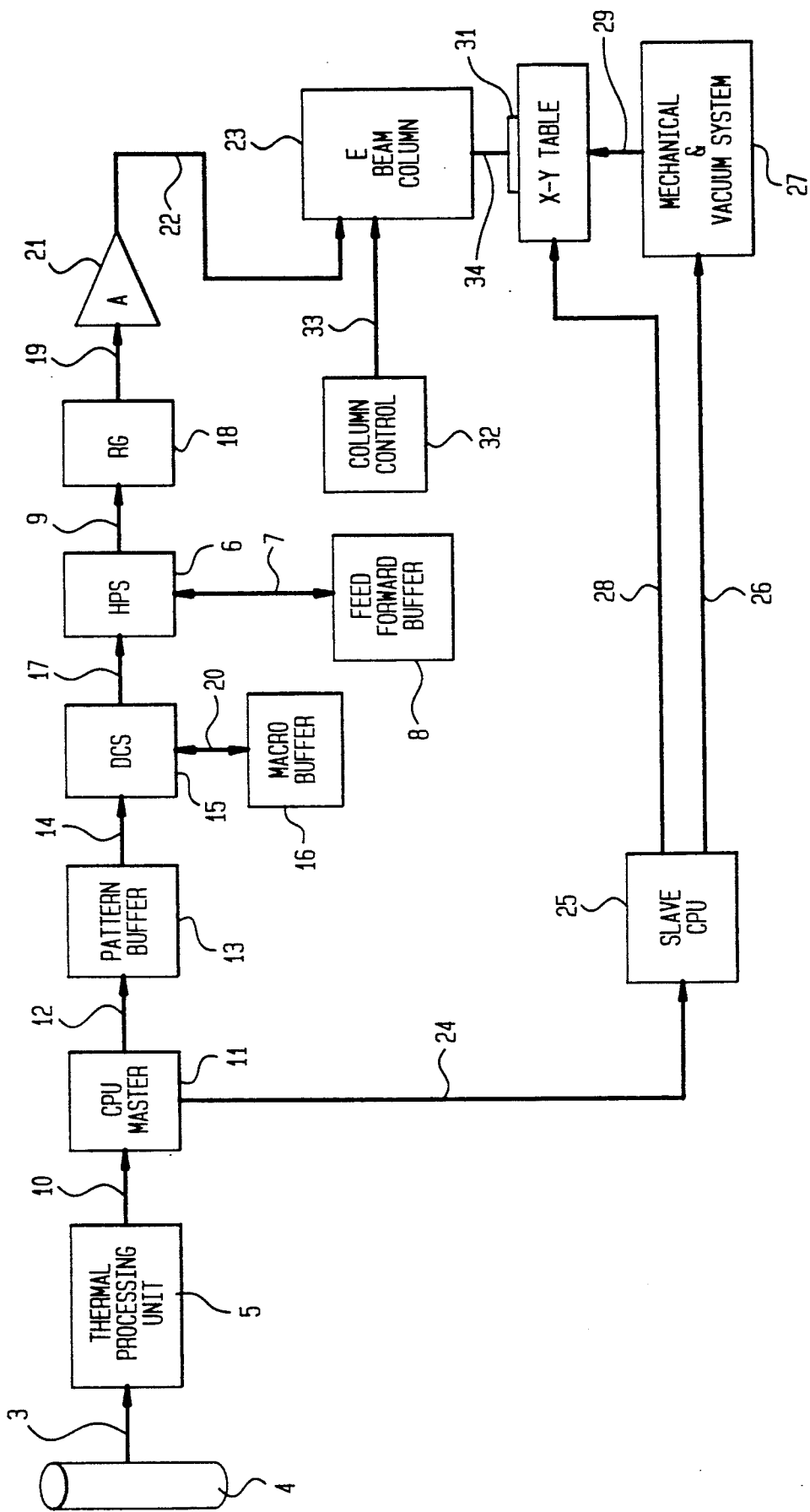
FIG. 1 shows an E-beam exposure system in accordance with this invention.

FIG. 1 shows a schematic diagram of a control system and an electron beam exposure apparatus. The output of a postprocessor numerical control data processing program is stored on disk 4 attached by bus 3 to Thermal Processing Unit (TPU) 5 which is a CPU. The TPU 5 analyses and (if necessary) modifies the NC (numerical control) data before feeding forward on bus 10 to CPU 11 which is the Master control for the system. Data bus 12 from the CPU 11 is connected to a pattern buffer 13 for storing several patterns to be processed by the system. The output of pattern buffer 13 connects via bus 14 to a Digital Control System (DCS) 15 coupled to its macro buffer 16 by bus 20. The output of the DCS 15 is supplied via bus 17 to a Hardware Pattern Splicing HPS unit 6 which has a Feed Forward Buffer 8 coupled to HPS unit 6 by bus 7. Buffer 8 contains the feed forward buffer memory and the NSF feed forward storage memory. The output of the HPS unit 6 is connected by bus 9 to rectangle generator circuit 18. The rectangle generator 18 passes its output via bus 19, amplifier 21, and lines 22 to the deflection circuits of an E-beam column 23 of an E-beam system as described in Chang and Waldman "A Computer-Controlled Electron-Beam Machine for Microcircuit Fabrication", IEEE Transactions on Electron Devices, pp. 629–635, (May 1972). Column 23 is connected by bus 33 to the output of column control 32. The CPU 11, also acting as a master computer in a master-slave relationship, connects through bus 24 to drive a slave processor CPU 25 as the slave using the post processed data from disk 4 to control the slave processor, CPU 25. The slave CPU 25 sends control data via line 26 to mechanical and vacuum system control unit 27 which has an output 29 connected to the X-Y control table 30, which supports a wafer 31. The slave also sends X-Y positioning information on bus 28 to the X-Y table 30.

Figure 2:
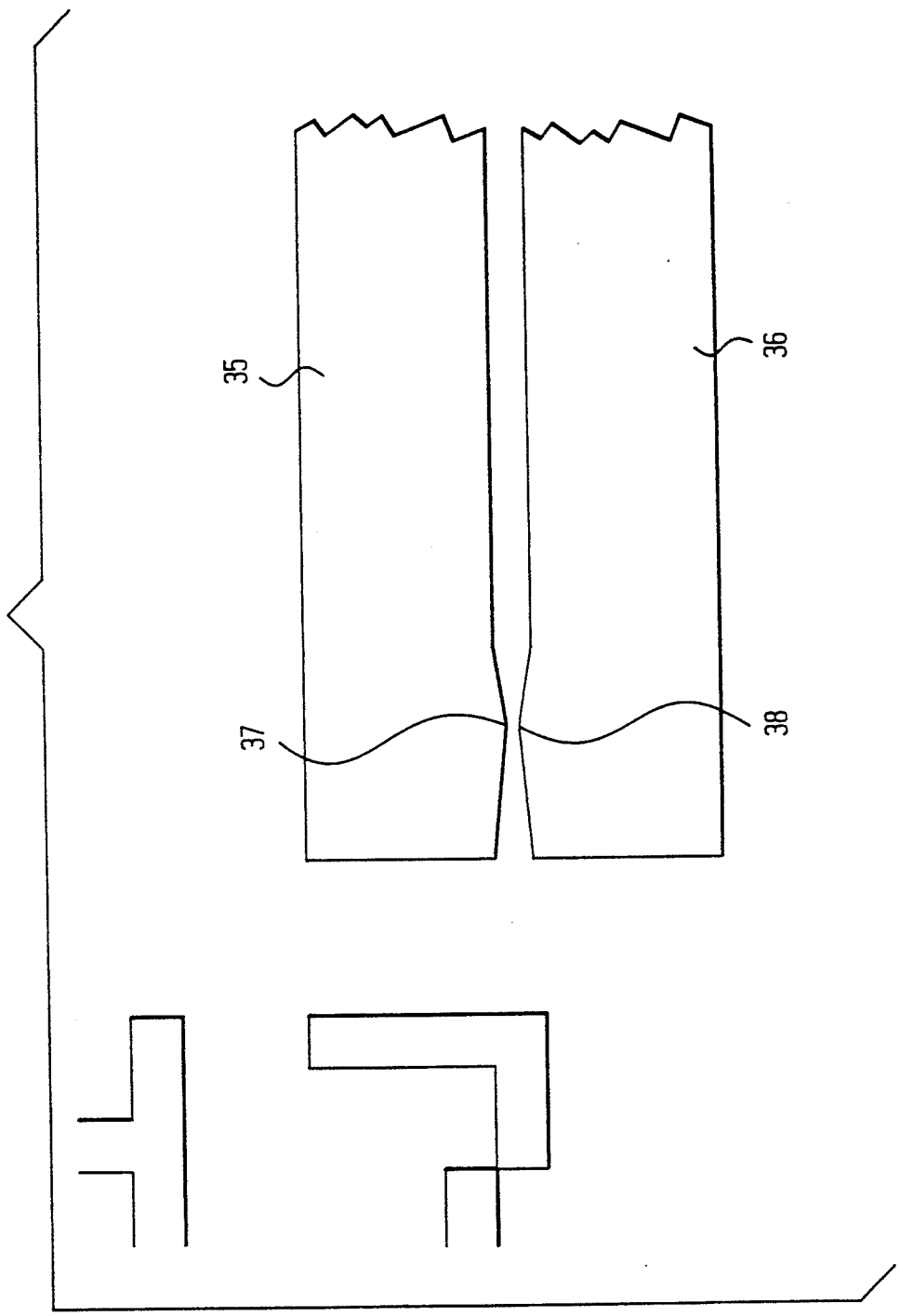
FIG. 2 is sketch of two patterns undergoing thermal blooming.

FIG. 2 is sketch of two patterns undergoing thermal blooming with the proximity being excessive near the left end of the legs 35 and 36 where the patterns have bloomed at 37 and 38.

Figure 3:
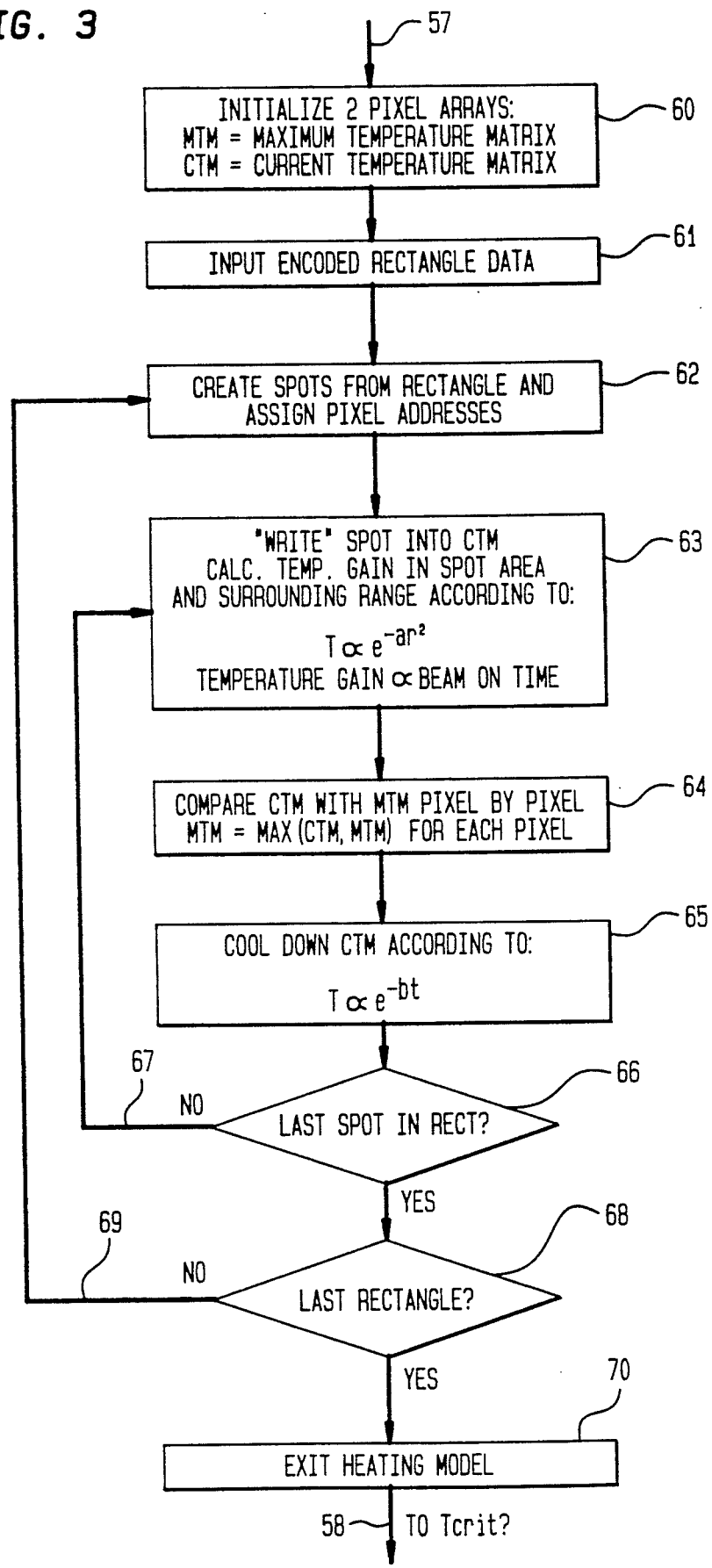
FIG. 3 is a flow chart of a thermal heating model in accordance with this invention.

A flow chart of the thermal heating model which is the subject of this invention is shown in FIG. 3. The thermal heating model uses as input the encoded rectangle data of the E-beam lithography system. This rectangle data contains information describing for each rectangle the X and Y position within a subfield, its height and width, whether the rectangle is to be sleeved by the E-beam hardware, and whether portions of the rectangle need to be exposed at a partial dose. In a variable exposure E-beam system, rectangle data is preceded by an exposure control word which determines the exposure value, or beam-on time of subsequent rectangles.

The thermal heating model operates on a E-beam systems numerical control data one subfield at a time. For each subfield, two matrices are initialized (60):
 MTM, the Maximum Temperature Matrix, and
 CTM, the Current Temperature Matrix.
The number of elements, or pixels, in each matrix is dependent upon the pixel size chosen. The pixel size will affect the running time of the model as well as its accuracy.

Exposure control records and E-beam rectangle data are input into the model one record at a time (step 61). For each rectangle, E-beam spots are created (step 62) according to the same logic used by the E-beam system's hardware, the rectangle generator 18 of FIG. 1. These spots are assigned pixel addresses according to their position and size as shown in Table 1. Each E-beam spot, in the same order as the actual exposure, is written into the the CTM (step 63). For all pixel addresses within thermal proximity range of the current spot, the temperature increase is calculated according the formula given in (step 63). Here temperature is defined as 'T', 'a' is a constant dependent upon the thermal conductivity of the substrate, and 'r' is the distance from the current spot. The temperature increase is proportional to the exposure value or beam-on time of the spot being written into the CTM.

For each pixel address, the CTM is compared to the MTM (step 64). The MTM is assigned the larger of the values of the MTM or the CTM. in this way, the maximum temperature seen by the E-beam sensitive resist is recorded.

The cooling down of the E-beam sensitive resist is calculated in (step 65). For each pixel address of the CTM, the temperature is decreased according the the formula given in (step 65). Here 'b' is a constant dependent upon the thermal conductivity of the substrate, and 't' is the total of the time required to expose the current spot and the time elapsed between the current spot and the next spot.

According the the logic of (step 66), steps 63, 64, 65 of FIG. 3 are repeated until there are no spots to process in the current rectangle. When the last spot of the current rectangle has been processed, a new rectangle is processed according to 68, 69, 62 of FIG. 3. When the last rectangle has been processed for the current subfield, (step 68), the heating model is exited (step 70). At this point, the MTM contains the maximum temperature seen by the E-beam resist for every pixel address in the subfield processed.

Figure 4:
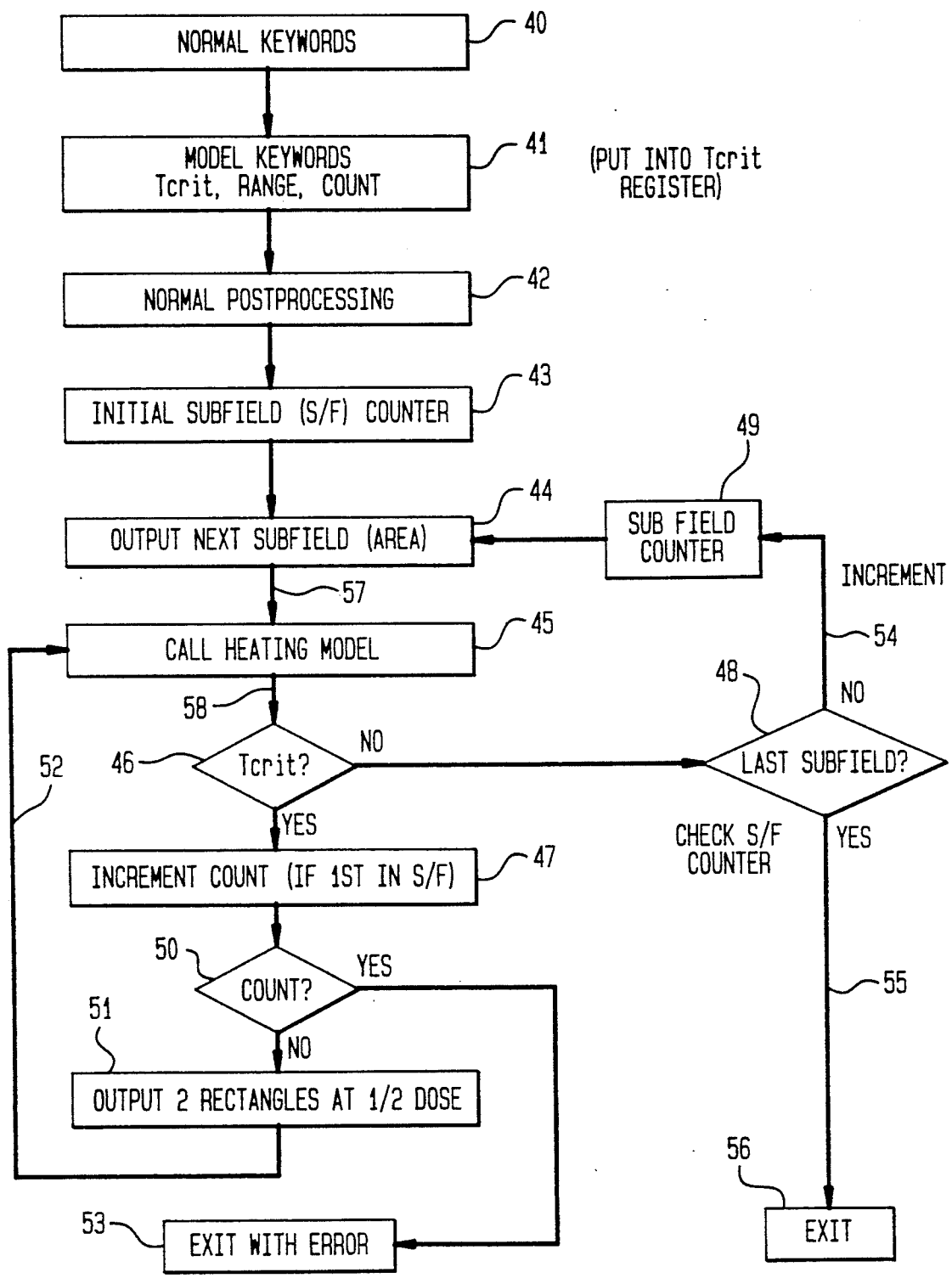
FIG. 4 is a flow chart of showing the thermal heating model of this invention incorporated in a postprocessor.

FIG. 4 is a Flow Chart showing how the Resist Heating Model (thermal heating model) can be implemented in a postprocessor. For a postprocessor with the thermal heating model embedded, the postprocessor's normal keywords (step 40) indicating shape filling parameters, process bias, resist basedose, E-beam field size information, etc. are input. In addition, keyword values particular to thermal heating are input to the postprocessor (step 41). These keywords would include Tcrit, a temperature above which thermal heating occurs that adversely affects the pattern's intended dimensions; RANGE, the distance from the current spot that the temperature increase should be calculated; and COUNT, a value which will limit the number of times the numerical control data may be modified as a result of thermal model predicting that Tcrit is reached while processing the current design. All normal processes of the postprocessor are performed (step 42) such as unioning of design shapes, applying process bias, filling with rectangles, assignment of dose, accounting for subfield boundary conditions, etc. Following these functions, the data is encoded in the E-beam system's format by subfield (step 43) and passes to the output next subfield area (step 44). For each subfield, the thermal heating model would be called (step 45). If the critical temperature Tcrit is reached (YES) in the current subfield (step 46), a counter is incremented (step 47). If the critical temperature is not reached (NO), then a check is made if the last subfield has been processed (step 48). If YES, then the postprocessor run is completed (step 56). If NO, then the next subfield is encoded (step 43). If the counter has been incremented (step 47), then the counter value is compared to the value of the input keyword COUNT (step 50). If the counter value is greater than COUNT, then the postprocessor run completes with an abnormal completion code (step 53). If the counter value is not greater than COUNT, then the postprocessor outputs 2 rectangles at half the assigned dose of each of the input rectangles for the current subfield (step 51). If the rectangle data for the current subfield has been modified as in (step 51), then the heating model may or may not be called (step 45) iteratively for the current subfield until Tcrit is not reached, depending upon implementation.

In this implementation of the thermal heating model, the postprocessed data is modified so as to lengthen the time over which areas are exposed that would otherwise result in excessive thermal resist heating. If the value COUNT is exceeded (step 50), for a particular postprocessing run, then a different solution may be indicated to avoid thermal resist heating. Since increasing the number of rectangles to avoid resist heating results in a longer E-beam exposure time, one would set the value of COUNT accordingly, balancing a loss of the E-beam system's thruput against the affects of other means of avoiding resist heating, such as decreasing the basedose of the resist process, or exposing the entire pattern twice at half the basedose.

Figure 5:
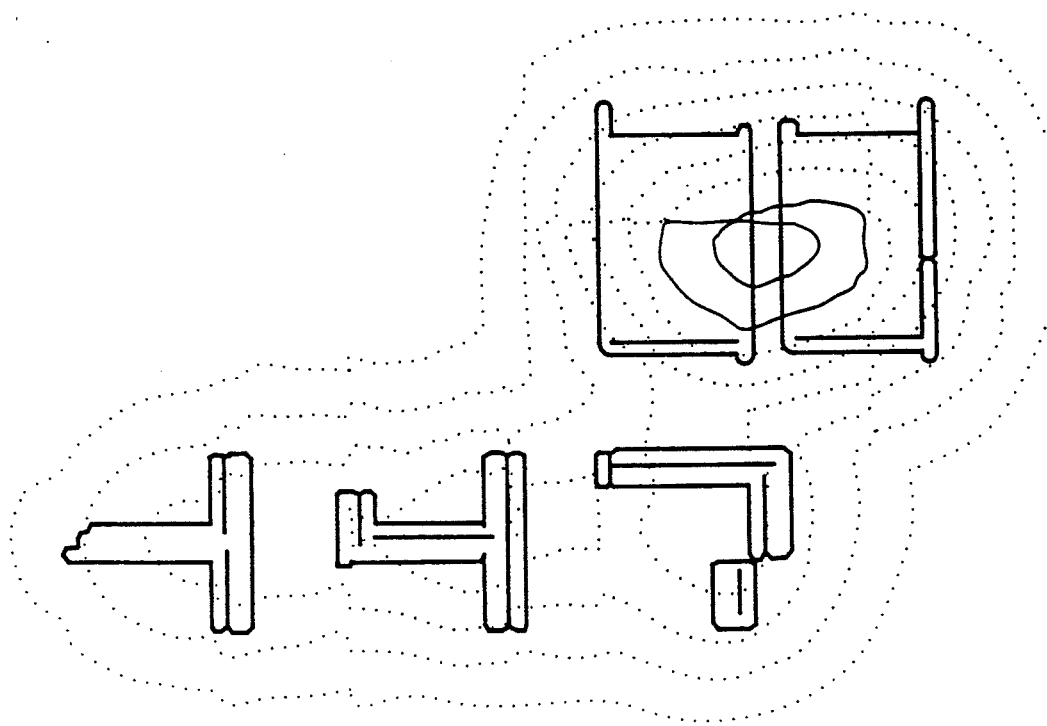
FIG. 5 is a plot showing the output of the model in a graphical format indicating a problem area.
Figure 6:
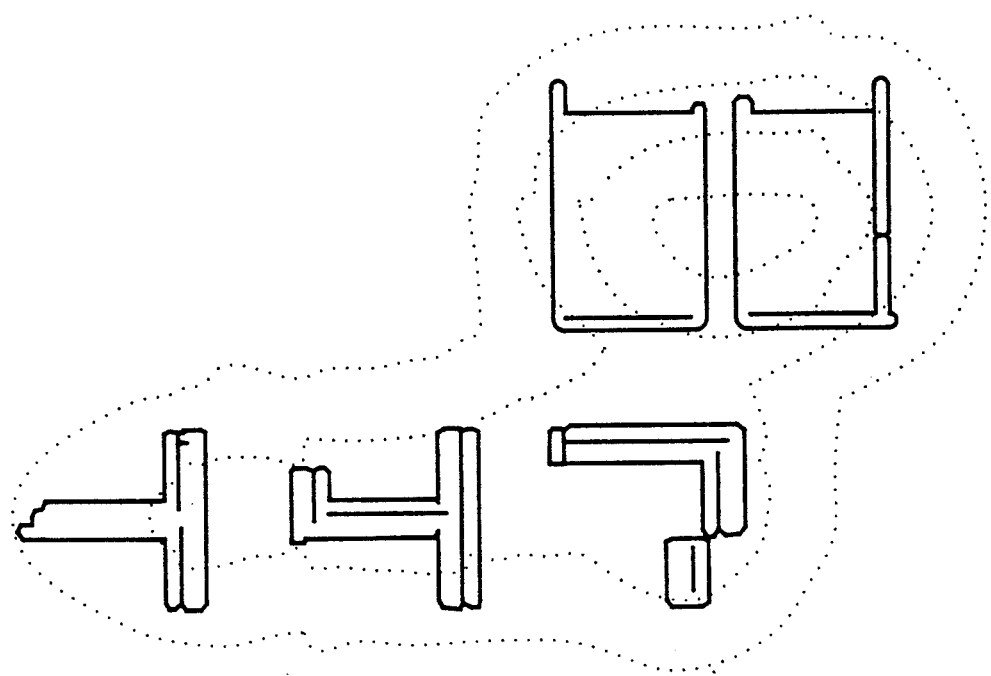
FIG. 6 is a plot showing the output of the model using the same CAD data as FIG. 5, but with different post-processing parameters showing a lower maximum temp.

The results of this model for two test cases are shown in FIGS. 5 and 6. Both FIGS. 5 and 6 show a contour plot of the MTM with the NC data super-imposed. Both cases were based on the same CAD data, and both give acceptable images—except in the region of maximum temperature in FIG. 5. The change in contours in FIG. 5 from a dotted line to a solid line indicate the regions where T>TCRIT. FIG. 5 is a plot showing the output of the model in a graphical format indicating a problem area. FIG. 6 is a plot showing the output of the model using the same CAD data as FIG. 5, but with different post-processing parameters showing a lower maximum temp.

TABLE 1 illustrates an E-beam rectangle subdivided into E-beam spots, and further subdivided into pixels. The numerical value of each spot corresponds to the order of exposure within the E-beam rectangle.

TABLE 2 illustrates the pixel representation of the temperature gain due to the energy input from a single E-beam spot.

TABLE 3 illustrates the pixel representation of the temperature gain due to the energy input from the single E-beam rectangle shown in Table 1 being 'maximum' added to the subfield pixel Maximum Temperature Matrix.

TABLE 2

| 0 | 0 | 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 1 | 2 | 4 | 6 | 6 | 6 | 6 | 6 | 4 | 2 | 1 | 0 | 0 | 0 | 0 | 0 | 0 | 0 | 0 |
| 1 | 3 | 6 | 11 | 15 | 16 | 16 | 16 | 16 | 15 | 11 | 6 | 3 | 1 | 0 | 0 | 0 | 0 | 0 | 0 |
| 2 | 6 | 13 | 22 | 30 | 33 | 33 | 33 | 33 | 30 | 22 | 13 | 6 | 2 | 0 | 0 | 0 | 0 | 0 | 0 |
| 4 | 11 | 22 | 37 | 50 | 55 | 55 | 55 | 55 | 50 | 37 | 22 | 11 | 4 | 0 | 0 | 0 | 0 | 0 | 0 |
| 6 | 15 | 30 | 50 | 67 | 75 | 75 | 75 | 75 | 67 | 50 | 30 | 15 | 6 | 0 | 0 | 0 | 0 | 0 | 0 |
| 6 | 16 | 33 | 55 | 75 | 83 | 83 | 83 | 83 | 75 | 55 | 33 | 16 | 6 | 0 | 0 | 0 | 0 | 0 | 0 |
| 6 | 16 | 33 | 55 | 75 | 83 | 83 | 83 | 83 | 75 | 55 | 33 | 16 | 6 | 0 | 0 | 0 | 0 | 0 | 0 |
| 6 | 16 | 33 | 55 | 75 | 83 | 83 | 83 | 83 | 75 | 55 | 33 | 16 | 6 | 0 | 0 | 0 | 0 | 0 | 0 |
| 6 | 16 | 33 | 55 | 75 | 83 | 83 | 83 | 83 | 75 | 55 | 33 | 16 | 6 | 0 | 0 | 0 | 0 | 0 | 0 |
| 6 | 15 | 30 | 50 | 67 | 75 | 75 | 75 | 75 | 67 | 50 | 30 | 15 | 6 | 0 | 0 | 0 | 0 | 0 | 0 |
| 4 | 11 | 22 | 37 | 50 | 55 | 55 | 55 | 55 | 50 | 37 | 22 | 11 | 4 | 0 | 0 | 0 | 0 | 0 | 0 |
| 2 | 6 | 13 | 22 | 30 | 33 | 33 | 33 | 33 | 30 | 22 | 13 | 6 | 2 | 0 | 0 | 0 | 0 | 0 | 0 |
| 1 | 3 | 6 | 11 | 15 | 16 | 16 | 16 | 16 | 15 | 11 | 6 | 3 | 1 | 0 | 0 | 0 | 0 | 0 | 0 |
| 0 | 1 | 2 | 4 | 6 | 6 | 6 | 6 | 6 | 4 | 2 | 1 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |

TABLE 3

| 0 | 0 | 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 1 | 2 | 4 | 6 | 6 | 6 | 6 | 6 | 6 | 6 | 6 | 6 | 6 | 6 | 4 | 2 | 1 | 0 |
| 1 | 3 | 6 | 11 | 15 | 16 | 16 | 16 | 16 | 16 | 16 | 16 | 16 | 16 | 16 | 15 | 11 | 6 | 3 | 1 |
| 2 | 6 | 13 | 22 | 30 | 33 | 33 | 33 | 33 | 33 | 33 | 33 | 33 | 33 | 33 | 30 | 22 | 13 | 6 | 2 |
| 4 | 11 | 22 | 37 | 50 | 55 | 55 | 55 | 55 | 55 | 55 | 55 | 55 | 55 | 55 | 50 | 37 | 22 | 11 | 4 |
| 6 | 15 | 30 | 50 | 67 | 75 | 75 | 75 | 75 | 75 | 75 | 75 | 75 | 75 | 75 | 68 | 50 | 30 | 15 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 16 | 33 | 55 | 75 | 83 | 83 | 83 | 83 | 83 | 83 | 83 | 83 | 83 | 83 | 75 | 55 | 33 | 16 | 6 |
| 6 | 15 | 30 | 50 | 67 | 75 | 75 | 75 | 75 | 75 | 75 | 75 | 75 | 75 | 75 | 68 | 50 | 30 | 15 | 6 |
| 4 | 11 | 22 | 37 | 50 | 55 | 55 | 55 | 55 | 55 | 55 | 55 | 55 | 55 | 55 | 50 | 37 | 22 | 11 | 4 |
| 2 | 6 | 13 | 22 | 30 | 33 | 33 | 33 | 33 | 33 | 33 | 33 | 33 | 33 | 33 | 30 | 22 | 13 | 6 | 2 |
| 1 | 3 | 6 | 11 | 15 | 16 | 16 | 16 | 16 | 16 | 16 | 16 | 16 | 16 | 16 | 15 | 11 | 6 | 3 | 1 |
| 0 | 1 | 2 | 4 | 6 | 6 | 6 | 6 | 6 | 6 | 6 | 6 | 6 | 6 | 6 | 4 | 2 | 1 | 0 |
| 0 | 0 | 0 | 0 | 0 | 0 | 0 | 0 | 0 | 0 | 0 | 0 | 0 | 0 | 0 | 0 | 0 | 0 | 0 | 0 |

TABLE 1

| 1 | 1 | 1 | 1 | 2 | 2 | 2 | 3 | 3 | 3 |
|---|---|---|---|---|---|---|---|---|---|
| 1 | 1 | 1 | 1 | 2 | 2 | 2 | 3 | 3 | 3 |
| 1 | 1 | 1 | 1 | 2 | 2 | 2 | 3 | 3 | 3 |
| 1 | 1 | 1 | 1 | 2 | 2 | 2 | 3 | 3 | 3 |
| 4 | 4 | 4 | 4 | 5 | 5 | 5 | 6 | 6 | 6 |
| 4 | 4 | 4 | 4 | 5 | 5 | 5 | 6 | 6 | 6 |
| 4 | 4 | 4 | 4 | 5 | 5 | 5 | 6 | 6 | 6 |
| 4 | 4 | 4 | 4 | 5 | 5 | 5 | 6 | 6 | 6 |

While this invention has been described in terms of the above embodiment(s), those skilled in the art will recognize that the invention can be practiced with modifications within the spirit and scope of the appended claims.

Having thus described the invention, what is claimed as new and desirable and desired to be secured by Letters Patent is as follows:

1. A method of adjusting exposure dose of an energy beam in a process for patternwise exposing a lithographic resist sensitive to said energy beam, wherein said process is characterized by individually exposing in sequence a plurality of areas of said resist, said method comprising a. adjusting the exposure dose for each of said plurality of areas as a function of proximity to other areas,
b. determining an individual exposure dose for each of said plurality of areas,
c. determining where in a pattern to be exposed the thermal energy level will exceed a critical level after exposure to said individual exposure dose, and
d. adjusting the pattern and level of exposure of said resist to a lower level equal to or less than said critical level with repeated exposures of said pattern in areas where said critical level is exceeded.

2. The method of claim 1 wherein said energy level comprises a thermal level measured as a temperature of said resist.

3. A method of adjusting exposure dose of an energy beam in a process for patternwise exposing a lithographic resist sensitive to said energy beam, wherein said process is characterized by individually exposing in sequence a plurality of areas of said resist, said method comprising a. adjusting the exposure dose for each of said plurality of areas as a function of proximity to other areas,
b. determining an individual exposure dose for each of said plurality of areas,
c. determining where in a pattern to be exposed the thermal energy level will exceed a critical level after exposure to said individual exposure dose, and
d. adjusting the pattern and duration of exposure of said resist to a longer duration providing exposures equal to or less than said critical level with the modified pattern of exposures of said pattern in areas where said critical level is exceeded.

4. The method of claim 3 wherein said energy level comprises a thermal level measured as a temperature of said resist.

5. The method of claim 3 wherein said duration of exposure is adjusted by increasing the duration of time between periods of exposing said resist to said energy beam.

* * * * *